United States Patent

Zhang et al.

(10) Patent No.: US 12,294,320 B2
(45) Date of Patent: May 6, 2025

(54) ELECTRIC MOTOR CONTROL DEVICE

(71) Applicant: Hitachi Industrial Equipment Systems Co., Ltd., Tokyo (JP)

(72) Inventors: Yu Zhang, Tokyo (JP); Yuuri Takano, Tokyo (JP); Hideto Takada, Tokyo (JP)

(73) Assignee: HITACHI INDUSTRIAL EQUIPMENT SYSTEMS CO., LTD., Tokyo (JP)

( * ) Notice: Subject to any disclaimer, the term of this patent is extended or adjusted under 35 U.S.C. 154(b) by 0 days.

(21) Appl. No.: 18/271,290

(22) PCT Filed: Dec. 23, 2021

(86) PCT No.: PCT/JP2021/048060
§ 371 (c)(1),
(2) Date: Jul. 7, 2023

(87) PCT Pub. No.: WO2022/269950
PCT Pub. Date: Dec. 29, 2022

(65) Prior Publication Data
US 2024/0072701 A1    Feb. 29, 2024

(30) Foreign Application Priority Data
Jun. 25, 2021   (JP) .................... 2021-106115

(51) Int. Cl.
*H02P 21/14* (2016.01)
*H02P 25/022* (2016.01)
*H02P 27/06* (2006.01)

(52) U.S. Cl.
CPC ........... *H02P 21/14* (2013.01); *H02P 25/022* (2013.01); *H02P 27/06* (2013.01)

(58) Field of Classification Search
CPC ......... H02P 21/14; H02P 25/022; H02P 27/06
See application file for complete search history.

(56) References Cited

U.S. PATENT DOCUMENTS

| 11,742,727 B2 * | 8/2023 | Prenner | H02K 11/25 310/68 C |
| 2013/0110449 A1 | 5/2013 | Cheng et al. | |

(Continued)

FOREIGN PATENT DOCUMENTS

| JP | H06-194240 A | 7/1994 |
| JP | 2008-168669 A | 7/2008 |

(Continued)

OTHER PUBLICATIONS (ISA/210) International Search Report, PCT/JP2021/048060, dated Feb. 8, 2022, 4pgs.

(Continued)

*Primary Examiner* — Zoheb S Imtiaz
(74) *Attorney, Agent, or Firm* — Volpe Koenig

(57) ABSTRACT

A electric motor control device comprising a converter section converting AC voltage to DC voltage, an inverter section converting DC voltage from the converter section to AC voltage and supplying said AC voltage to electric motor, an inverter control unit controlling said inverter section, a current detection unit detecting the current flowing in said electric motors and a power calculation unit estimating the temperature of said electric motors from said detected current, calculating the resistance of said electric motors from said estimated temperature, and calculating the copper loss from said calculated resistance.

8 Claims, 9 Drawing Sheets

(56) References Cited

U.S. PATENT DOCUMENTS

| | | | |
|---|---|---|---|
| 2014/0200727 A1 | 7/2014 | Takahashi et al. | |
| 2015/0263509 A1* | 9/2015 | Senoo | G01K 7/00 |
| | | | 318/473 |
| 2018/0299838 A1* | 10/2018 | Ueda | G05B 15/02 |
| 2020/0231135 A1* | 7/2020 | Ito | B60L 15/02 |
| 2023/0019205 A1* | 1/2023 | Murakami | H02P 27/06 |
| 2023/0163715 A1* | 5/2023 | Nakamura | H02P 29/662 |
| | | | 318/473 |
| 2024/0014765 A1* | 1/2024 | Kamiya | H02P 29/662 |

FOREIGN PATENT DOCUMENTS

| | | |
|---|---|---|
| WO | 2014/109057 A1 | 7/2014 |
| WO | 2016/157382 A1 | 10/2016 |

OTHER PUBLICATIONS (ISA237) Written Opinion of the International Searching Authority, PCT/JP2021/048060, dated Jan. 28, 2022, 4pgs.

\* cited by examiner

ELECTRIC MOTOR CONTROL DEVICE

TECHNICAL FIELD

This invention relates to electric motor control devices.

BACKGROUND ART

In the patent document 1, there are means for detecting the current I and voltage V on the DC side of the electric motor control device, means for detecting the d-axis current value Id and q-axis current value Iq controlled by the inverter that is part of the electric motor control device, means for detecting the temperature inside the induction machine, means for detecting the rotation speed N of the induction machine and a torque calculation device that calculates the shaft torque based on these detection signals and performs temperature compensation wherein the torque calculation device calculate based on the formula $T=K/N\cdot[IV-K1\cdot\alpha\cdot r1\cdot(Id^2+Iq^2)-K2\cdot\alpha\cdot r2\cdot Iq^2-E]$

CITATION LIST

Patent Document

Patent Documents 1 Japanese Unexamined Patent Publication No. H6-194240.

SUMMARY OF THE INVENTION

Problems to be Solved by the Invention

In the patent document 1, power calculation can be performed without expensive power detection transducers, but the resistance value used to calculate the copper loss changes with changes in temperature, so a temperature detector must be used to calculate the correct value. In addition, adding a temperature detector increases the cost, not only because of the cost of the temperature detector, but also because of costs incurred in various areas, such as changes in board design, mold changes on the manufacturing line, and so on.

The purpose of the present invention is to provide an electric motor control device that calculates the power consumption of electric motors at low cost.

A preferred example of the present invention is the electric motor control device comprising a converter section for converting an alternating current voltage into a direct current voltage, an inverter section for converting a direct current voltage from the converter section into an alternating current voltage and supplying said alternating current voltage to electric motors, an inverter control section for controlling said inverter section, a current detection section for detecting a current flowing in said electric motors, a power calculation unit estimating a temperature of said electric motors from the detected current, calculating the resistance value of the electric motors from the estimated temperature and calculates the copper loss from the calculated resistance value.

Effects of the Invention

According to the present invention, it is possible to realize an electric motor control device that calculates the power consumption of electric motors at low cost.

MODE FOR CARRYING OUT THE INVENTION

The following is an example of the invention with reference to the drawings.

EXAMPLE 1

Figure 1:
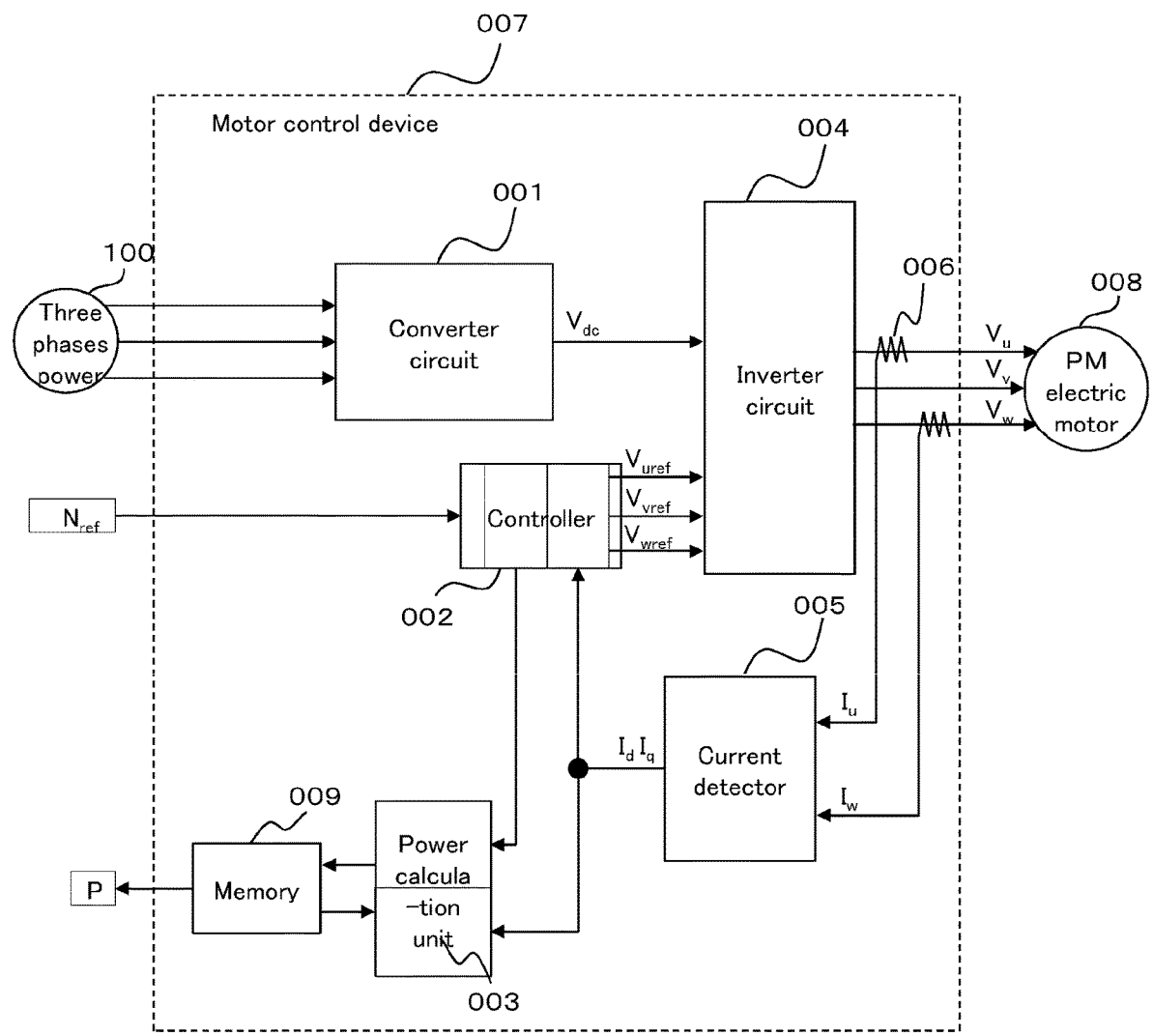
FIG. 1: Block diagram of the electric motor control device in example 1.
Figure 2:
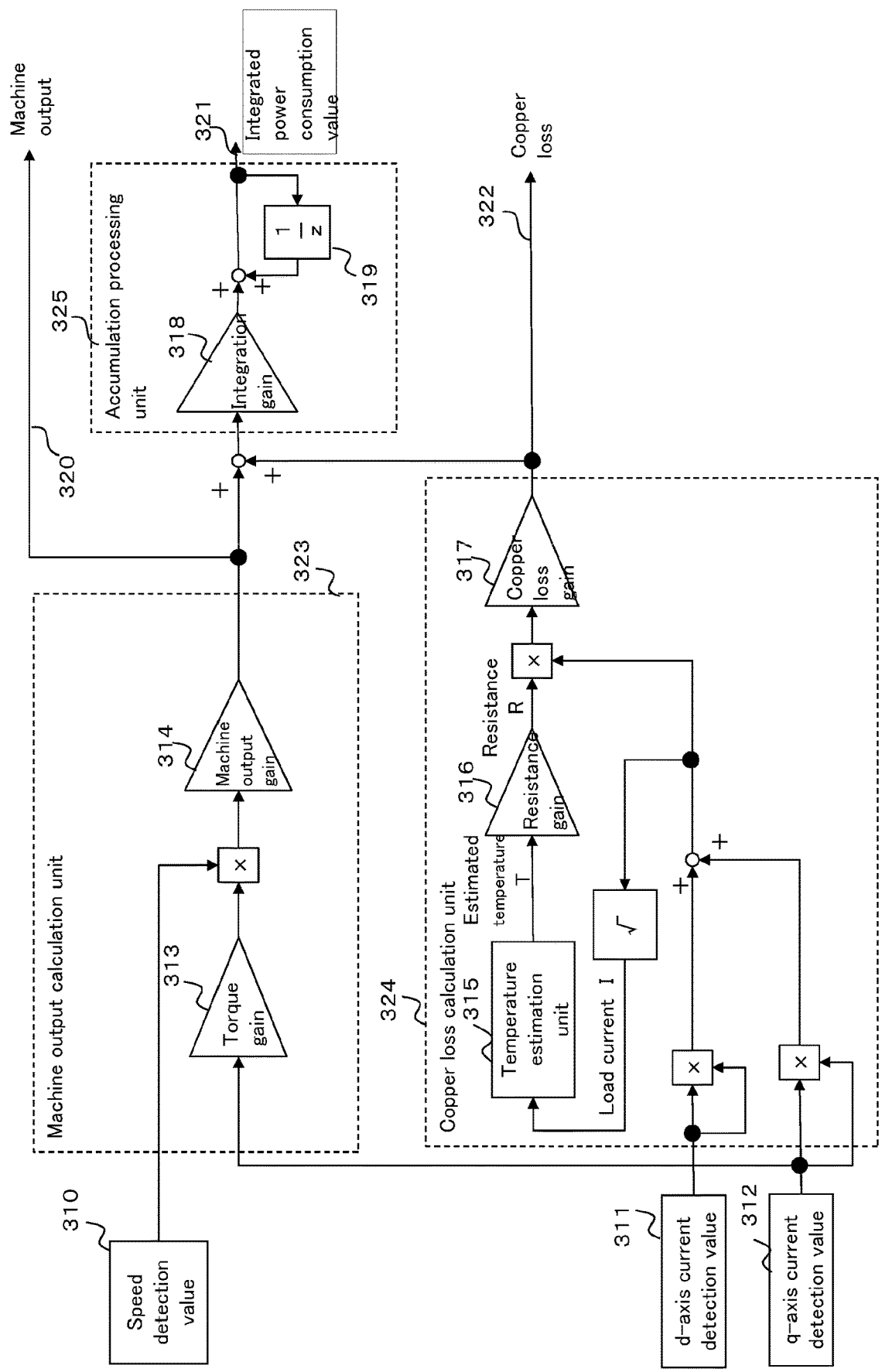
FIG. 2: An example of a functional block diagram of the power calculation unit in example 1.
Figure 3:
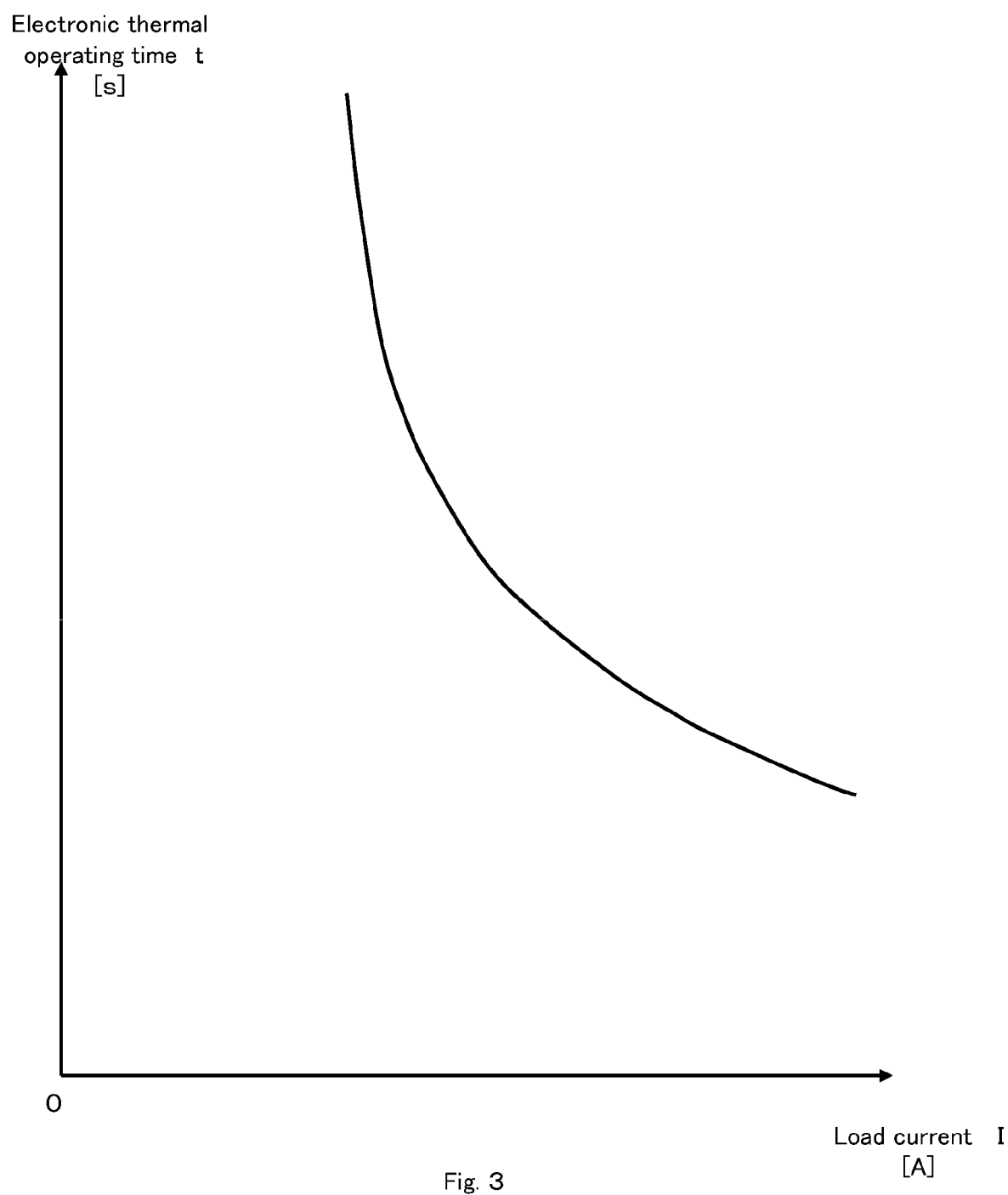
FIG. 3 Figure shows the relationship between thermal operation time and the current flowing in electric motors.

FIGS. 1 through 3 are used to illustrate example 1.

FIG. 1 is an example of a block diagram showing the configuration of the electric motor control device with the addition of the power calculation unit of example 1. In addition to the electric motor control device 007, FIG. 1 shows a three-phase power supply 100 that supplies power to the electric motor control device 007 and loads, etc.

The load is, for example, PM electric motors (three-phase permanent magnet synchronous motors) 008. Electric motor control device 007 is equipped with inverter circuit 004, converter circuit 001, current detector 005, controller 002, power calculation unit 003, current sensor 006, and memory 009.

Converter circuit 001 converts three-phase AC voltage from external three-phase power source 100 to DC voltage Vdc and supplies it to inverter circuit 004. Inverter circuit 004 converts said DC voltage Vdc to AC voltage (three-phase voltage Vu, Vv, Vw), The three-phase AC voltages Vu, Vv, and Vw are supplied (energized) to PM electric motors (PM motors) 008.

Current sensor 006 is installed to connect to the supply lines of said three-phase AC voltages Vu, Vv, and Vw. Current detector 005 detects the load current flowing in PM electric motors 008 via current sensor 006.

In this example, current detector 005 detects u-phase current Iu and w-phase current Iw via current sensor 006, calculates Iv based on the current values of Iu and Iw, changes said three-phase currents Iu, Iv and Iw in coordinates, and calculates d-axis current detection value Id and q-axis current detection value Iq. Then, current detector 005 detects the load current value I by vector synthesizing the d-axis current detection value Id and q-axis current detection value Iq.

Controller 002 (inverter control section) controls the inverter circuit 004 to bring the operating state of PM electric motors 008 closer to the target state. In this example, controller 002 receives an external speed command value Nref and generates three-phase voltage command values Vuref, Vvref and Vwref to rotate PM electric motors at a rotational speed based on said speed command value Nref using position sensor-less vector control.

Specifically, controller 002 estimates the rotation speed of PM electric motors 008 using, for example, an induced voltage observer, calculates the d- and q-axis current command values based on the error between said rotation speed and the speed command value Nref, and calculates the three-phase voltage command values Vuref, Vvref, and Vwref based on the error between said current command values and the d-axis current detection value Id and q-axis current detection value Iq, the three-phase voltage command values Vuref, Vvref, and Vwref are calculated.

Inverter circuit 004 generates three-phase AC voltages Vu, Vv, and Vw by switching operation with PWM (Pulse Width Modulation) signals based on three-phase voltage command values Vuref, Vvref, and Vwref. For example, the rotation speed of PM electric motors 008 can be derived from the time difference result of the position detector output and input to controller 002.

Here, the output power from the three-phase power source 100 is expressed as in formula (1) below.

[Formula 1]

$$\text{Output power}(Pout) = \text{Converter loss}(Pconv) + \text{Conversion loss}(Ptrans) + \text{Iron loss}(Ps) + \text{Copper loss}(Pc) + \text{Mechanical loss}(Pmechaloss) + \text{Machine output}(Pmecha) \quad (1)$$

Here, the converter loss (Pconv) in formula (1) is the loss generated by the converter circuit 001 inside the electric motor control device 007. The conversion loss (Ptrans) is the loss generated by the inverter circuit 004 inside the electric motor control device 007. Iron loss (Ps) is the loss due to magnetic hysteresis and eddy currents in the magnetic material core inside PM electric motors 008. Copper losses (Pc) are power losses due to currents in the windings inside PM electric motors 008. Mechanical losses (Pmechaloss) are losses due to friction of the various parts during rotation. Mechanical output (Pmecha) is the effectively utilized power finally output from PM electric motors 008 to the load.

Since the other losses are small compared to the copper loss (Pc), only the copper loss is considered when calculating the power for this invention. Therefore, the calculation of power is simplified as in formula (2).

[Formula 2]

$$\text{Output power}(Pout) = \text{Machine output}(Pmecha) + \text{Copper loss}(Pc) \quad (2)$$

The calculations of machine output (Pmecha) and copper loss (Pc) in formula (2) are then expressed in formula (3) and (4), respectively.

[Formula 3]

$$\text{Machine output}(Pmecha) = \tau \times \omega \times Kmecha \quad (3)$$

Where $\tau$ is the torque of PM electric motors 008. $\omega$ is the speed detection value 310 of PM electric motors 008. Kmecha is the machine output gain 314.

[Formula 4]

$$\text{Copper loss}(Pc) = (Iq^2 + Id^2) \times Rt \times Kc \quad (4)$$

Where Iq is the q-axis current detection value 312 detected from current detector 005, Id is the d-axis current detection value 311 detected from current detector 005, Rt is the phase resistance of PM electric motors 008, Kc is the copper loss gain 317.

The phase resistance Rt varies with the temperature T of PM electric motors 008, which can be obtained from the thermal curve of thermal operation time t and load current I. An example of the thermal curve of thermal operation time t of PM electric motors (vertical axis) and an example of the thermal curve of the load current I (horizontal axis) flowing in PM electric motors is shown in FIG. 3.

Figure 9:
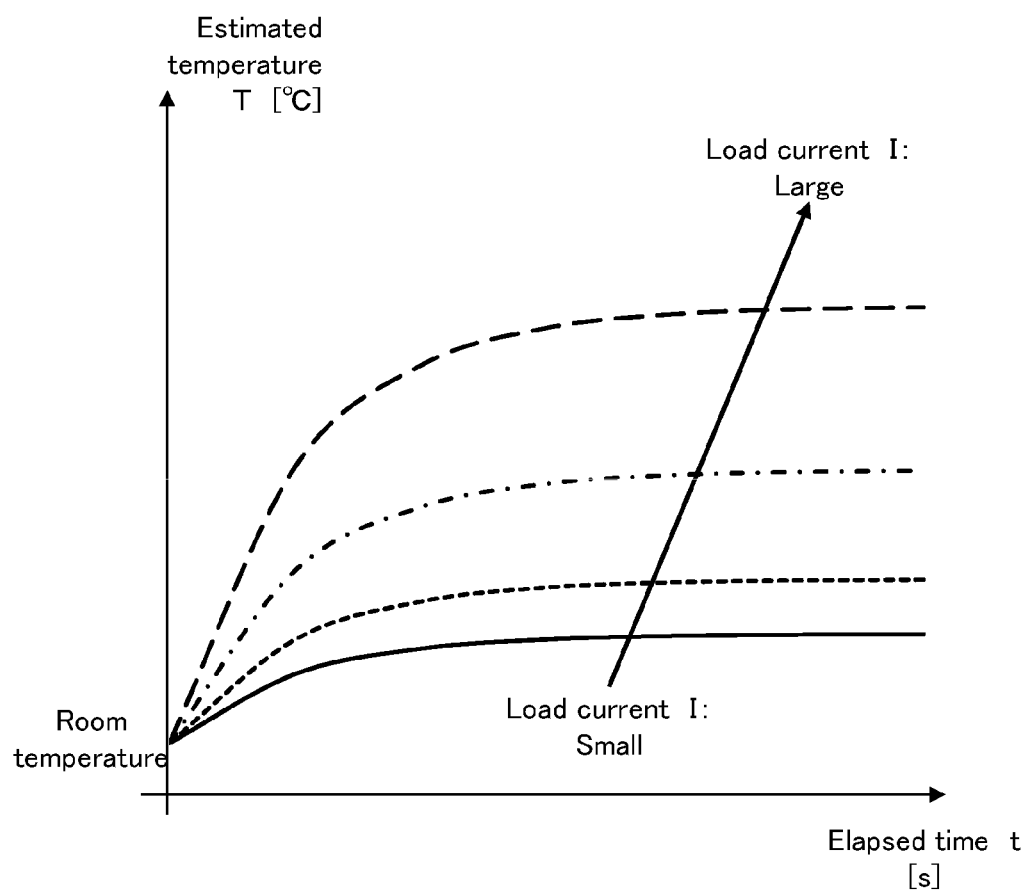
FIG. 9: Figure of relationship between estimated temperature, elapsed time, and load current.

FIG. 9 shows the relationship between the estimated temperature of PM electric motors, the load current flowing through PM electric motors, and the elapsed time used in the electronic thermal process. As shown by the solid and dotted lines, the estimated temperature increases as the load current increases. This correspondence between the load current and the estimated temperature can be recorded as a table in the memory of the temperature estimation section, etc., so that the temperature of PM electric motors can be estimated based on the load current.

Formula (5) expresses the relationship between the phase resistance Rt and the temperature T. Rt is the resistance of the phase resistance of PM electric motors 008 when the temperature of PM electric motors 008 reaches T. R20 is the resistance of the phase resistance of PM electric motors 008 at 20° C. α20 is the temperature coefficient of resistance of the metal copper at a temperature of 20° C.

[Formula 5]

$$Rt = R20 \times (1 + \alpha 20 \times (T - 20)) \quad (5)$$

Power calculation unit 003 calculates the power consumption of PM electric motors 008 using formula (2), (3), (4) and (5). d-axis current detection value 311 and q-axis current detection value 312 from current detector 005 and, speed detection value ω310 from controller 002, the machine output and copper loss are calculated, and the actual power consumption P is stored in memory 009 as a variable and displayed on an external device. FIG. 2 is used to illustrate the specifics.

Controller 002, current detector 005, and power calculation unit 003 are composed of semiconductor integrated circuits (arithmetic and control means) such as microcomputers and digital signal processor (DSP). Any or all of the control unit can be composed of hardware such as ASIC (Application Specific Integrated Circuit) or FPGA (Field Programmable Gate Array). The DSP or CPU (Central Processing Unit) that makes up controller 002, current detector 005, and power calculation unit 003 reads a program held in a memory or other storage device and executes the processing of controller 002, current detector 005, and power calculation unit 003.

FIG. 2 shows an example of a functional block diagram of the power calculation unit 003 in this example. FIG. 2 shows the process of calculating output data via the machine output calculation unit 323, the copper loss calculation unit 324, and the integration process unit 325 from input data. The input data are, for example, the speed detection value ω 310, the d-axis current detection value 311, and the q-axis current detection value 312. The output data are, for example, machine output 320, integrated power consumption 321, and copper loss 322. The machine output calculation unit 323 has a torque gain 313 and a machine output gain 314. The copper loss calculation unit 324 has a temperature estimation section 315, a resistance gain 316, and a copper loss gain 317. The integration process section 325 has an integration gain 318 and a 1/z (unit delay section) 319.

Various gains, such as torque gain, resistance gain, and mechanical output gain, are set in advance as constants or other values.

The machine output calculation unit 323 is described below. The machine output calculation unit 323 inputs the speed detection value ω 310 received from controller 002 and the q-axis current detection value 312 received from current detector 005.

The machine output calculation unit 323 multiplies the q-axis current detection value 312 by the torque gain 313 to calculate the actual torque τ of the PM electric motors 008. The machine output calculation unit 323 multiplies the calculated torque τ by the speed detection value ω 310 to calculate the internal amount of machine output. Then, the machine output calculation unit 323 multiplies the calculated internal amount of machine output by the machine output gain 314 to calculate the machine output 320 of PM electric motors 008.

Figure 8:
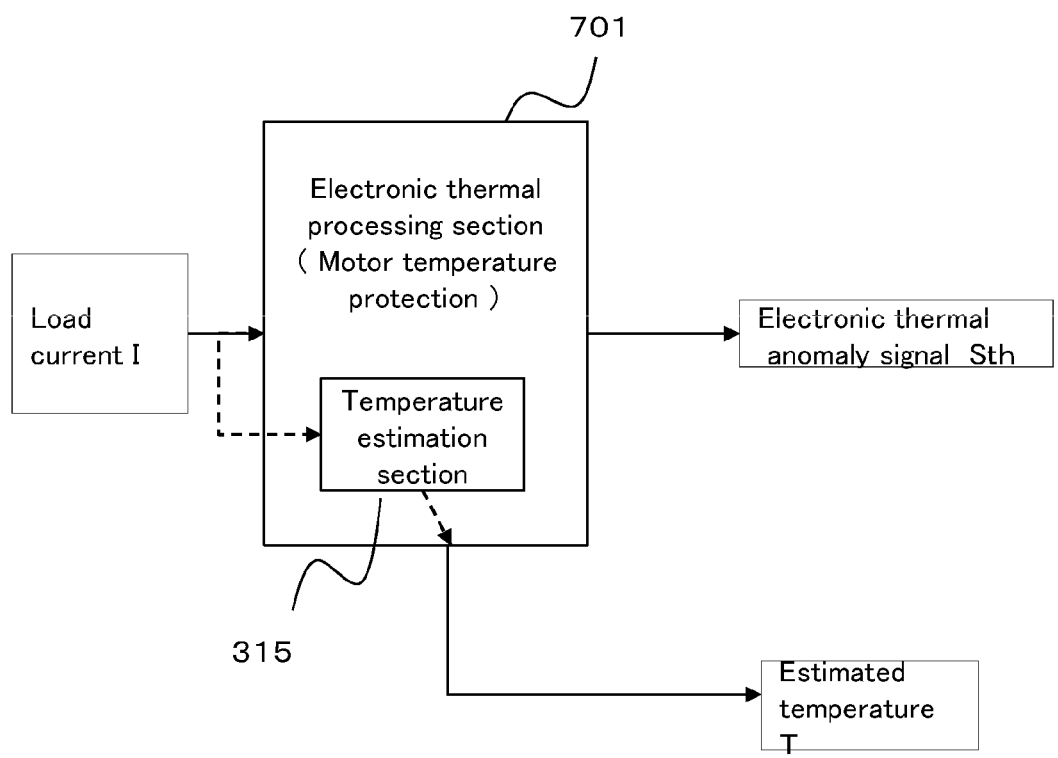
FIG. 8: Figure of temperature estimation section that outputs the estimated temperature from the load current.

The copper loss calculation unit 324 is described below. As shown in FIG. 8, the load current I, which is the input of the electronic thermal processing section 701 that protects the temperature of the electric motors, can be configured to be the input of the temperature estimation section 315.

Based on the d-axis current detection value 311 and q-axis current detection value 312 from current detector 005, temperature estimation section 315 inputs the value of load current I (square root of the sum of the square of the d-axis current detection value 311 and the square of the q-axis current detection value 312). The temperature estimation section 315 estimates the estimated temperature T of PM electric motors 008 from the correspondence between the recorded load current and the estimated temperature. The copper loss calculation unit 324 multiplies the estimated temperature by the resistance gain to calculate the actual resistance Rt of PM electric motors 008.

The copper loss calculation unit 324 calculates the internal amount of copper loss by multiplying the calculated resistance Rt by the sum of the square of the d-axis current detection value 311 and the square of the q-axis current detection value 312. The copper loss calculation unit 324 multiplies the calculated internal amount of copper loss by the copper loss gain 317 to calculate the copper loss 322 of PM electric motors 008.

Finally, the integration processing section 325 is described. The integration processing section 325 calculates the power consumption for each processing sampling cycle by multiplying the sum of the calculated machine output 320 and copper loss 322 by the integration gain 318. Unit delay section 319 takes the previous value and adds it to the power consumption for the current sampling cycle. The final output of the integral processing section 325 is the integrated power consumption value 321.

The machine output 320, which is the output of the power calculation unit 003 in this example, the copper loss 322 and the integrated power consumption 321 are stored in memory 009 as variables.

According to this example, the temperature can be estimated from the detected current value and a highly accurate copper loss calculation can be performed by performing a correction calculation of the resistance value, allowing the power consumption of PM electric motors to be calculated without the use of a temperature detector. Instead of a temperature detector, the actual resistance value can be corrected by estimating the temperature from the detected current value. The copper loss calculation using this resistance value can be used to calculate the power consumption of PM electric motors with the same accuracy as the copper loss calculation using a thermometer.

EXAMPLE 2

Figure 4:
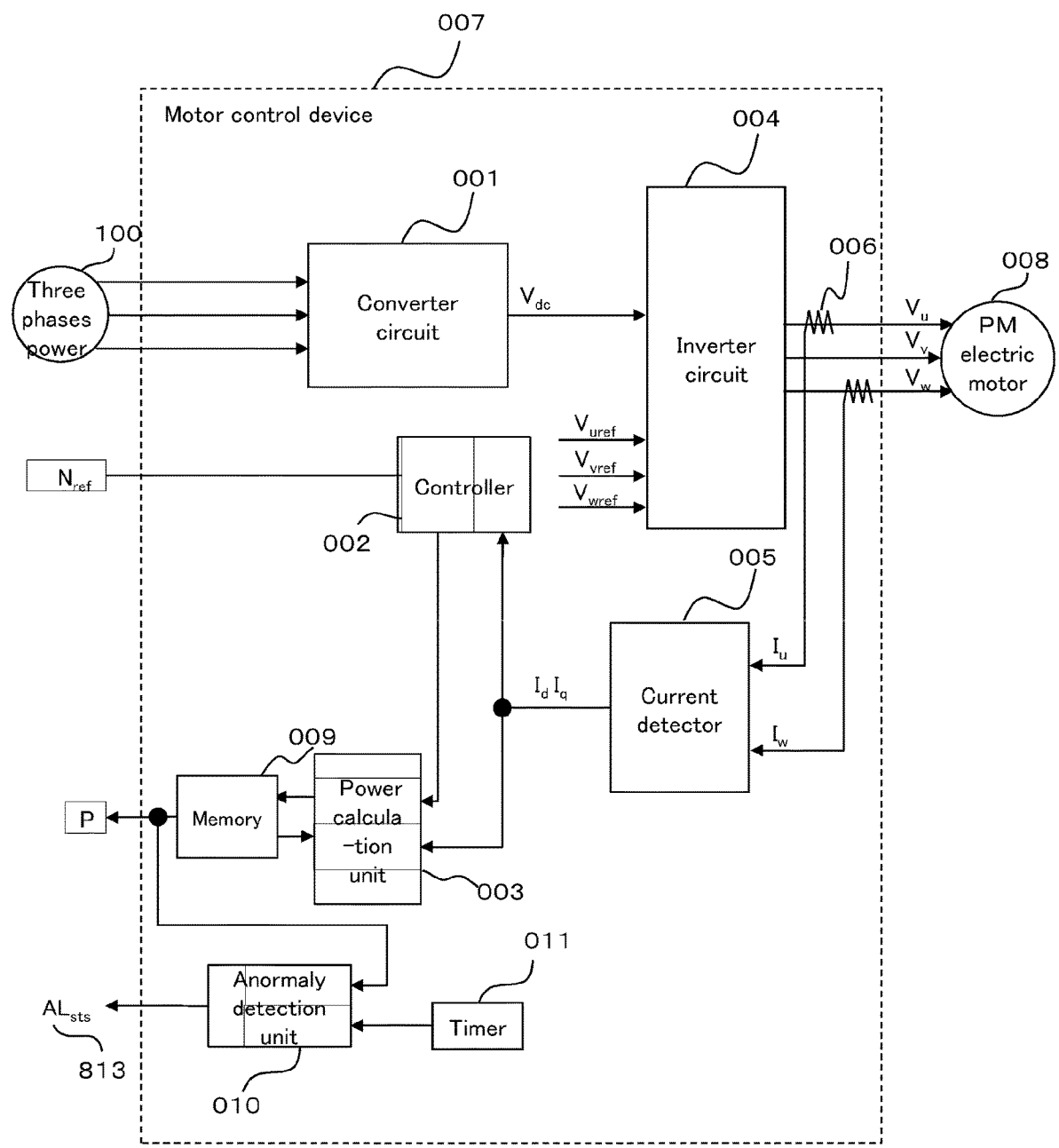
FIG. 4: Block diagram of the configuration of the electric motor control device in example 2.
Figure 5:
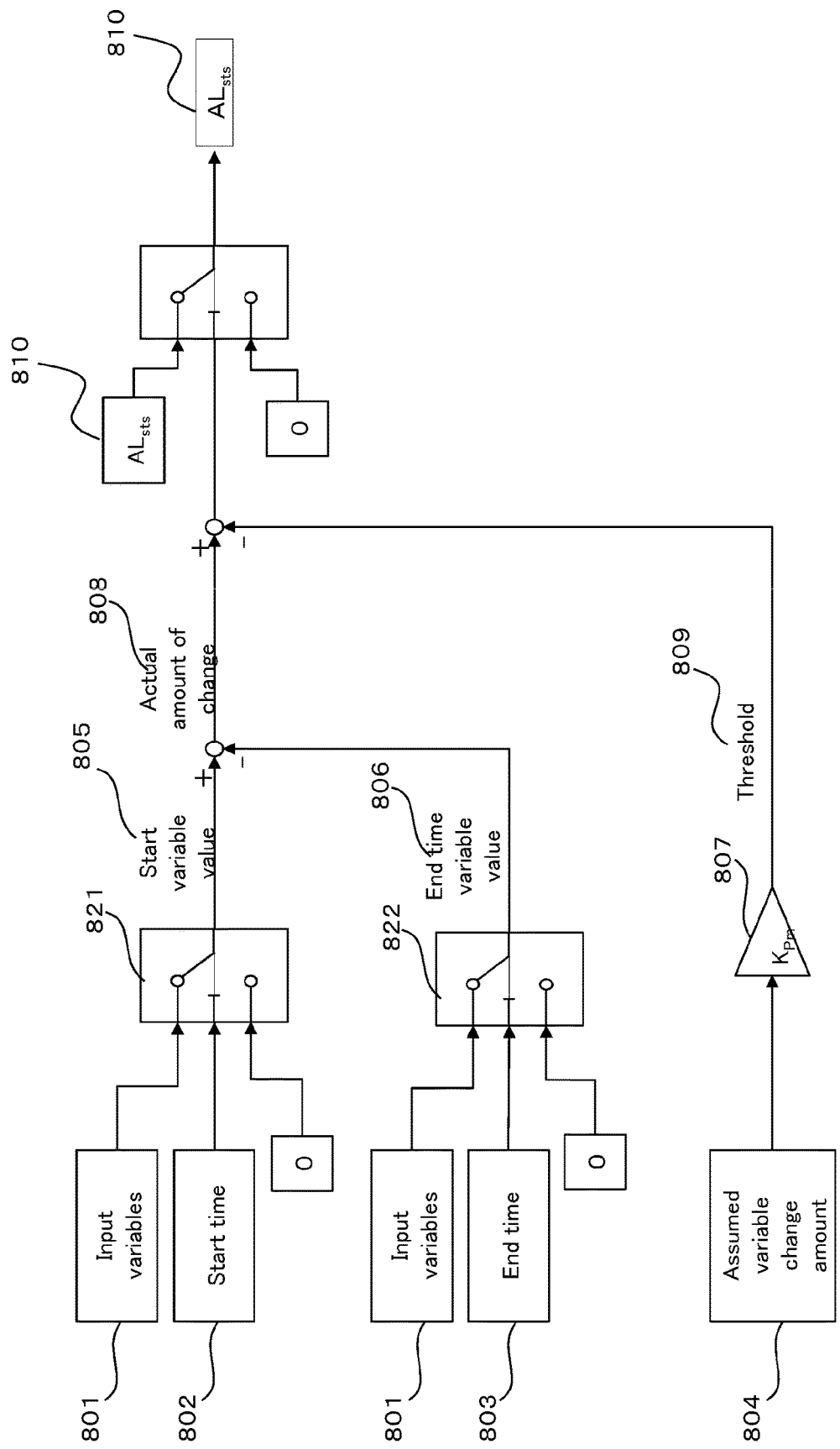
FIG. 5: Functional block diagram of the anomaly detection unit in example 2.

FIGS. 4 and 5 illustrate example 2.

FIG. 4 is an example of a block diagram showing the configuration of electric motor control device 007 with the addition of power calculation unit 003, memory 009, timer 011 and anomaly detection unit 010 in this example. Among the configurations shown in FIG. 4, those with the same symbols as those in FIG. 1 are the same as those in FIG. 1 and are therefore omitted from the explanation.

Anomaly detection unit 010 inputs data stored in memory 009 (machine output 320 and copper loss 322) and time information from timer 011. It then outputs an alarm ALsts signal 810 when an abnormality is detected.

FIG. 5 is an example of a functional block diagram of anomaly detection unit 010 in this example. One of the copper loss 322 and machine output 320 is predetermined and selected by the user or others as the value of input variable 801. Anomaly detection unit 010 has a start time 802 and an end time 803. Anomaly detection unit 010 has a timer 011.

The value of input variable 801 at start time 802 passes through the first switch 821 and is accumulated in the first switch 821 as zero except at start time 802. The output of the first switch 821 is the start variable value 805 (copper loss 322 or machine output 320 at start) at start time 802.

The value of input variable 801 at end time 803 passes through the second switch 822 and is accumulated at the second switch 822 as zero except at end time 803, and the output of the second switch 822 is the end time variable value 806 (copper loss 322 and machine output 320 at end time).

Anomaly detection unit 010 takes the difference between the start variable values 805 and end time variable value 806, which are the outputs of the first 821 and second 822 switches and calculates the actual amount of change 808. The anomaly detection unit 010 also has an assumed variable change amount 804, which is the ideal calculation amount.

The anomaly detection unit 010 multiplies the assumed variable change amount 804 by the adjustment gain $K_{Pm}$ 807 to calculate the threshold value 809 for safe operation. The threshold value 809 is compared with the actual amount of change 808, and when it exceeds the threshold value 809, the alarm ALsts signal 810 is output as an abnormality.

When the alarm ALsts signal 810 is received by an external device or other device, it is issued as an abnormality notification with a physical sound or light alarm. For example, sound a warning tone or flash a lamp.

According to this example, for example, an abnormal load is added to the load device, and the user is quickly notified when abnormal current flows, power becomes abnormally large, or other abnormalities occur, and can take action.

EXAMPLE 3

Figure 6:
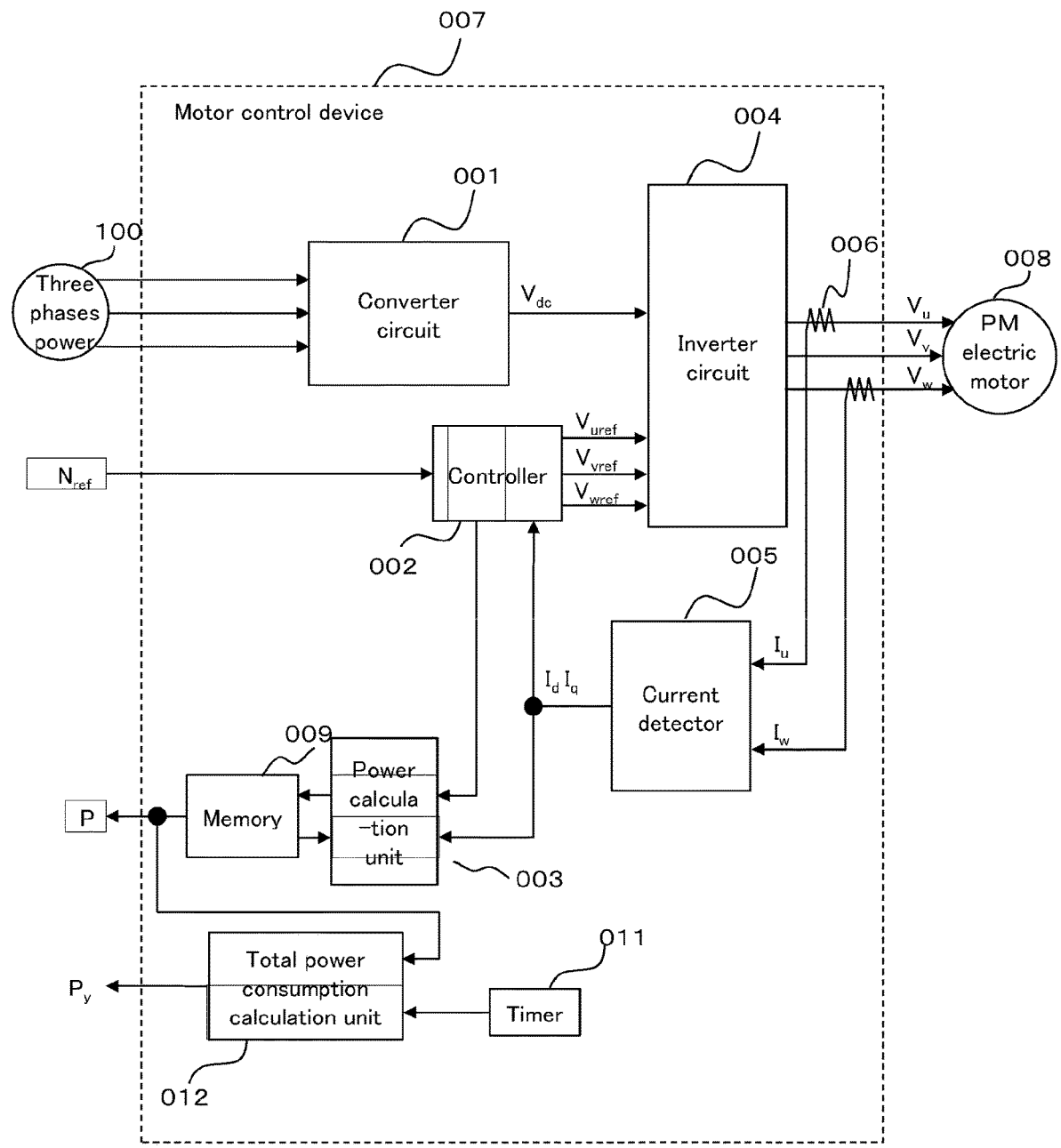
FIG. 6: Block diagram of the electric motor control device in example 3.
Figure 7:
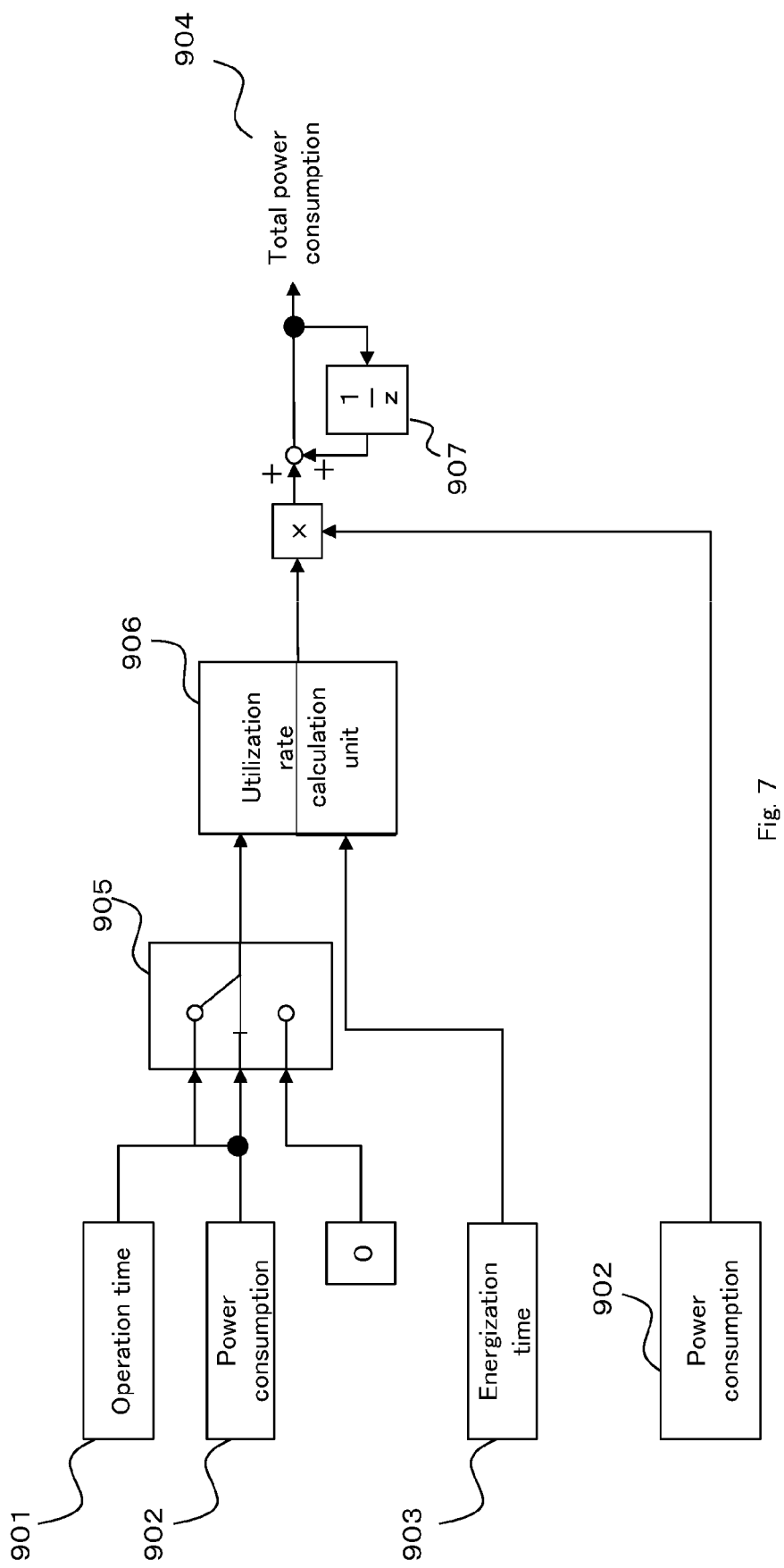
FIG. 7: Functional block diagram of the total consumption calculation section in example 3.

FIGS. 6 and 7 illustrate example 2.

FIG. 6 is a block diagram showing the configuration of an electric motor control device with the addition of power calculation unit 003, memory 009, timer 011 and total power consumption calculation unit 012 in this example. The configuration shown in FIG. 6 is an example. Of the configurations shown in FIG. 6, those with the same symbols as those in FIG. 1 are the same as those in FIG. 1 and are therefore omitted from the explanation.

Total power consumption calculation unit 012 inputs power consumption 902 (sum of machine output 320 and copper loss 322) from memory 009, energization time 903 and time information from timer 011. The output Py of total power consumption calculation unit 012 is the total power consumption 904.

FIG. 7 shows an example of the functional block diagram of the total power consumption calculation unit 012. For example, the calculation of total power consumption refers to formula (6).

[Formula 6]

$$\text{total power consumption 904} = \int_{t=0}^{\text{expected energization time 909}} \text{Consumption 902} \times \frac{\text{Operation time 901}}{\text{energization time 903}} dt \quad (6)$$

The expected energization time 909 is the expected energization time for a certain period of time (e.g., yearly, monthly, weekly, etc.). Power consumption 902 is the sum of machine output 320 and copper loss 322 from memory 009 as shown in formula (2).

The energization time 903 is the time of the sampling cycle from timer 011. Operation time 901 is the time of the sampling cycle time during which the power consumption is actually positive.

When the power consumption 902 is positive, the switch 905 passes the operating hours 901 and power consumption 902 to the utilization rate calculation unit 906. The utilization rate calculation unit 906 of the total power consumption calculation unit 012 then calculates the utilization rate in the utilization rate calculation unit 906 together with the actual energized time 903 in PM electric motors 008.

Total power consumption calculation unit 012 multiplies the operating rate and power consumption 902. The result of that multiplication is input to the integral processing unit (1/z) 907. The integral processing unit 907 integrates up to the annual energized hours 909 and calculates and outputs the annual power consumption 908.

According to this example, it is possible to estimate the total weekly, monthly, yearly, etc. power consumption that one wishes to predict from the actual operating figures, which leads to more efficient plant management because the amount of power consumption can be determined.

The anomaly detection unit 010, timer 011, and total power consumption calculation unit 012 shown in examples 2 or 3 are composed of a semiconductor integrated circuit (arithmetic and control means) such as microcomputer or a DSP (Digital Signal Processor) as in the above-mentioned controllers. The DSP or CPU (Central Processing Unit) reads a program stored in a memory or other storage device to perform the anomaly detection, timer 011, and total power consumption calculation unit 012, which are shown in example 3 above.

The invention is not limited to the above examples but includes various variations. For example, the above examples are described in detail to explain the invention in an easy-to-understand manner and are not necessarily limited to those having all the described configurations. It is also possible to replace a part of the configuration of one example with that of another example, and it is also possible to add the configuration of another example to that of one example. It is also possible to add, delete, or replace some of the configurations of each example with other configurations.

REFERENCE SIGNS LIST

001 . . . Converter circuit
002 . . . Controller
003 . . . Power calculation unit
004 . . . Inverter circuit
010 . . . Anomaly detection unit
012 . . . Total power consumption calculation unit

The invention claimed is:

1. A electric motor control device for an electric motor, the electric motor control device comprising:
   a converter circuit that converts a first AC voltage to a DC voltage,
   an inverter circuit the DC voltage from the converter circuit to a second AC voltage and supplies the second AC voltage to the electric motor,
   an inverter controller that control the inverter circuit,
   a current detector that detects a current flowing in the electric motors and
   a power calculation unit that is configured to:
   estimate a temperature of the electric motors from the current detected by the current detector,
   calculate a resistance value of the electric motors from the temperature estimated,
   calculate a machine output from a q-axis detected current value and a detected speed value,
   calculate a copper loss from the resistance value calculated,
   calculate a first difference between the copper loss at a start time and an end time,
   calculate a second difference between the machine output at the start time and the end time, and
   output an alarm signal when either the first difference or the second difference exceeds a respective threshold value.

2. The electric motor control device according to claim 1, wherein the power calculation unit is further configured to:
   calculate a power consumption totalization value based on the copper loss and the machine output.

3. An electric motor control device, for an electric motor, the electric motor control device comprising:
   a converter circuit that converts a first AC voltage to a DC voltage,
   an inverter circuit the DC voltage from the converter circuit to a second AC voltage and supplies the second AC voltage to the electric motor,
   an inverter controller that control the inverter circuit,
   a current detector that detects a current flowing in the electric motors and
   a power calculation unit that is configured to:
   estimate a temperature of the electric motors from the current detected by the current detector,
   calculate a resistance value of the electric motors from the temperature estimated,
   calculate a machine output from a q-axis detected current value and a detected speed value,
   calculate a copper loss from the resistance value calculated, and
   calculate a total power consumption from:
   a sum of the copper loss and the machine output,
   operating time from the time when power consumption is positive,
   operating rate from an operating time and an energization time,
   total power consumption from the operating rate,
   the power consumption, and
   the energization time.

4. The electric motor control device according to claim 1, wherein the temperature of the electric motor is estimated based on a correspondence between the current detected and the temperature.

5. The electric motor control device according to claim 4, wherein the current detected is a load current that is calculate from a d-axis current detection value and the q-axis current detection value.

6. The electric motor control device according to claim 3, wherein the power calculation unit is further configured to:
   calculate a power consumption totalization value based on the copper loss and the machine output.

7. The electric motor control device according to claim 3, wherein the temperature of the electric motor is estimated based on a correspondence between the current detected and the temperature.

8. The electric motor control device according to claim 7, wherein the current detected is a load current that is calculate from a d-axis current detection value and the q-axis current detection value.

* * * * *